(12) United States Patent
Seibel, II et al.

(10) Patent No.: US 9,537,052 B2
(45) Date of Patent: *Jan. 3, 2017

(54) COATED PHOSPHORS AND LIGHT EMITTING DEVICES INCLUDING THE SAME

(71) Applicant: Cree, Inc., Durham, NC (US)

(72) Inventors: Harry A. Seibel, II, Morrisville, NC (US); Brian Thomas Collins, Holly Springs, NC (US)

(73) Assignee: Cree, Inc., Durham, NC (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/246,375

(22) Filed: Apr. 7, 2014

(65) Prior Publication Data
US 2014/0217326 A1    Aug. 7, 2014

Related U.S. Application Data

(62) Division of application No. 13/152,833, filed on Jun. 3, 2011, now Pat. No. 8,729,790.

(51) Int. Cl.
*C09K 11/02*    (2006.01)
*H01L 33/26*    (2010.01)
(Continued)

(52) U.S. Cl.
CPC ............. *H01L 33/26* (2013.01); *C09K 11/025* (2013.01); *C09K 11/0883* (2013.01); *C09K 11/7706* (2013.01); *C09K 11/883* (2013.01); *H01L 33/005* (2013.01); *H01L 33/502* (2013.01); *H01L 2224/48091* (2013.01); *H01L 2224/48465* (2013.01)

(58) Field of Classification Search
CPC ...... H01L 33/26; H01L 33/005; H01L 33/502; C09K 11/025; C09K 11/883; C09K 11/0883; C09K 11/7706
See application file for complete search history.

(56) References Cited

U.S. PATENT DOCUMENTS 4,918,497 A    4/1990    Edmond
4,966,862 A    10/1990    Edmond
(Continued)

FOREIGN PATENT DOCUMENTS

CN    101081980 A    12/2007
JP    2008-092549    9/1996
(Continued)

OTHER PUBLICATIONS

International Search Report and Written Opinion of the International Searching Authority for PCT/US2011/027362; Date of Mailing: May 5, 2011; 16 pages.
(Continued)

*Primary Examiner* — Britt D Hanley
(74) *Attorney, Agent, or Firm* — Brinks Gilson & Lione

(57) ABSTRACT

Provided according to embodiments of the invention are method of coating a phosphor that include contacting the phosphor with a sol comprising at least one of silica, alumina, borate and a precursor thereof, to form a coating on the phosphor; and heating the phosphor. Also provided are phosphors that are coated with alumina, silica and/or borate, and light emitting devices that include such phosphors.

15 Claims, 6 Drawing Sheets

(51) Int. Cl.
  *C09K 11/08* (2006.01)
  *C09K 11/77* (2006.01)
  *C09K 11/88* (2006.01)
  *H01L 33/50* (2010.01)
  *H01L 33/00* (2010.01)

(56) References Cited

U.S. PATENT DOCUMENTS

| | | | |
|---|---|---|---|
| 5,027,168 A | 6/1991 | Edmond | |
| 5,196,229 A | 3/1993 | Chau | |
| 5,210,051 A | 5/1993 | Carter | |
| 5,338,944 A | 8/1994 | Edmond et al. | |
| 5,359,345 A | 10/1994 | Hunter | |
| 5,393,993 A | 2/1995 | Edmond et al. | |
| 5,416,342 A | 5/1995 | Edmond et al. | |
| 5,523,589 A | 6/1996 | Edmond et al. | |
| 5,604,135 A | 2/1997 | Edmond | |
| 5,631,190 A | 5/1997 | Negley et al. | |
| 5,739,554 A | 4/1998 | Edmond et al. | |
| 5,744,233 A | 4/1998 | Opitz et al. | |
| 5,747,100 A * | 5/1998 | Petersen | C09K 11/025 427/157 |
| 5,912,477 A | 6/1999 | Negley et al. | |
| 6,120,600 A | 9/2000 | Edmond et al. | |
| 6,187,606 B1 | 2/2001 | Edmond et al. | |
| 6,201,262 B1 | 3/2001 | Edmond et al. | |
| 6,600,175 B1 | 7/2003 | Baretz et al. | |
| 6,791,119 B2 | 9/2004 | Slater et al. | |
| 6,853,010 B2 | 2/2005 | Slater et al. | |
| 6,958,497 B2 | 10/2005 | Emerson et al. | |
| 7,095,056 B2 | 8/2006 | Vitta et al. | |
| 7,202,598 B2 | 4/2007 | Juestel et al. | |
| 7,213,940 B1 | 5/2007 | Van de Ven et al. | |
| 7,456,499 B2 | 11/2008 | Loh et al. | |
| 7,564,180 B2 | 7/2009 | Brandes | |
| 8,125,139 B2 | 2/2012 | Emoto et al. | |
| 8,643,038 B2 | 2/2014 | Collins et al. | |
| 2002/0105266 A1* | 8/2002 | Juestel et al. | 313/512 |
| 2004/0033309 A1* | 2/2004 | Fardad | G02B 6/12004 427/162 |
| 2004/0256974 A1 | 12/2004 | Mueller-Mach et al. | |
| 2006/0024436 A1* | 2/2006 | Bayya | B01J 2/006 427/212 |
| 2006/0221272 A1 | 10/2006 | Negley et al. | |
| 2006/0255713 A1 | 11/2006 | Kondo et al. | |
| 2007/0125984 A1 | 6/2007 | Tian et al. | |
| 2007/0139923 A1 | 6/2007 | Negley et al. | |
| 2007/0158668 A1 | 7/2007 | Tarsa et al. | |
| 2007/0170447 A1 | 7/2007 | Negley et al. | |
| 2007/0223219 A1 | 9/2007 | Medendorp et al. | |
| 2007/0253209 A1 | 11/2007 | Loh et al. | |
| 2007/0278935 A1 | 12/2007 | Harada | |
| 2008/0012036 A1 | 1/2008 | Loh et al. | |
| 2008/0121921 A1 | 5/2008 | Loh et al. | |
| 2008/0173884 A1 | 7/2008 | Chitnis et al. | |
| 2008/0179611 A1 | 7/2008 | Chitnis et al. | |
| 2008/0198112 A1 | 8/2008 | Roberts | |
| 2008/0241590 A1 | 10/2008 | Kim et al. | |
| 2008/0258602 A1 | 10/2008 | Masuda et al. | |
| 2008/0283864 A1 | 11/2008 | LeToquin et al. | |
| 2008/0308825 A1 | 12/2008 | Chakraborty et al. | |
| 2009/0050907 A1 | 2/2009 | Yuan et al. | |
| 2009/0050908 A1 | 2/2009 | Yuan et al. | |
| 2009/0080185 A1 | 3/2009 | McMillan | |
| 2009/0108281 A1 | 4/2009 | Keller et al. | |
| 2009/0184616 A1 | 7/2009 | Van de Ven | |
| 2009/0218581 A1 | 9/2009 | Schmidt et al. | |
| 2009/0283721 A1 | 11/2009 | Liu et al. | |
| 2010/0213816 A1 | 8/2010 | Saruta et al. | |
| 2010/0252851 A1 | 10/2010 | Emerson et al. | |
| 2010/0283076 A1 | 11/2010 | Winkler et al. | |
| 2010/0289044 A1 | 11/2010 | Krames et al. | |
| 2012/0207923 A1 | 8/2012 | Baumgartner | |

FOREIGN PATENT DOCUMENTS

| | | | |
|---|---|---|---|
| JP | 2007-169452 | | 7/2007 |
| JP | 2007169452 A | * | 7/2007 |
| JP | 2009-2936035 | | 12/2009 |
| JP | 2011-503266 | | 1/2011 |
| WO | WO 2007023439 A2 | | 3/2007 |
| WO | WO 2011-045216 | | 4/2011 |

OTHER PUBLICATIONS

International Search Report and Written Opinion for PCT/US2012/040102; Date of Mailing: Aug. 31, 2012; 10 pages.
Japanese Office Action for Japanese Patent Application No. 2014-513678, dated Jan. 19, 2015, pp. 1-5.
Chinese Office Action for Chinese Patent Application No. 2012-80037810.3, dated Nov. 23, 2015, pp. 1-8.
International Preliminary Report on Patentability for International Patent Application No. PCT/US2012/040102 dated Dec. 19, 2013, 6 pp.
Office Action for Chinese Patent Application No. 201280037810.3, dated Sep. 23, 2014 (English Translation), 12 pages.
Search Report for Chinese Patent Application No. 201280037810.3, dated Sep. 11, 2014 (English Translation), 3 pages.
Examination Report for European Patent Application No. 12726991.8-1355, dated Nov. 20, 2014, 6 pages.

* cited by examiner

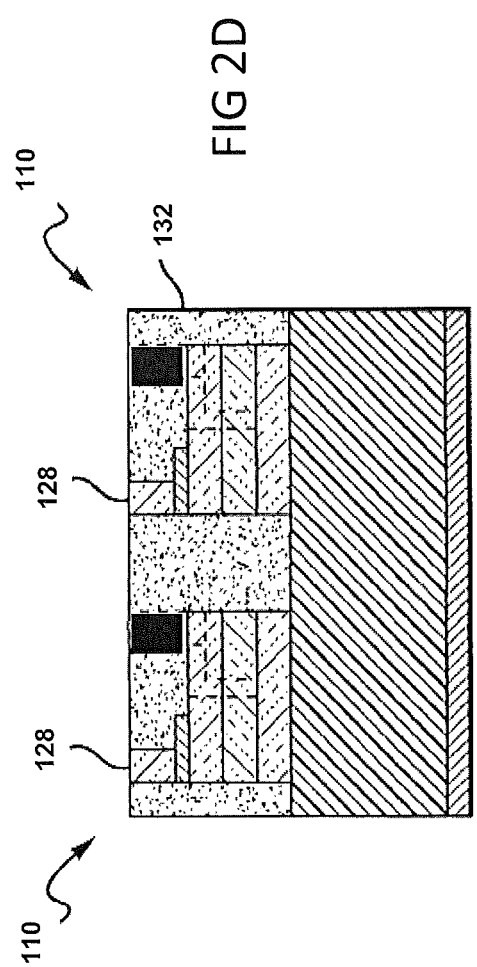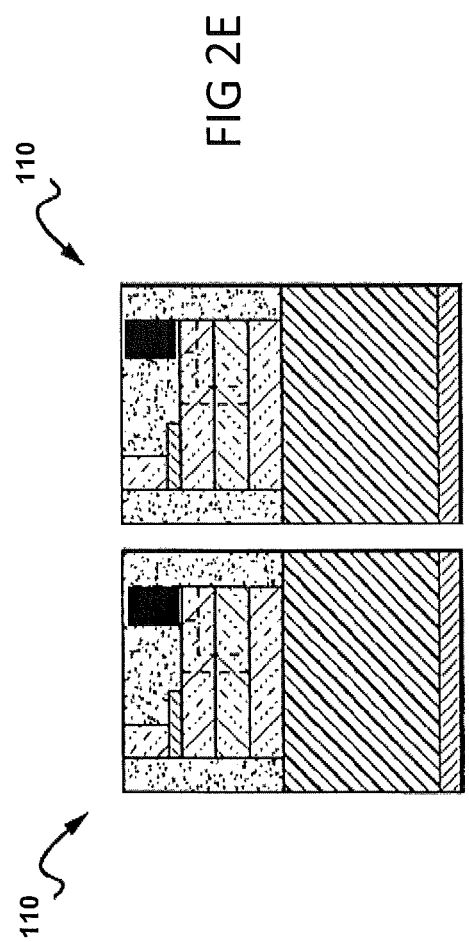

COATED PHOSPHORS AND LIGHT EMITTING DEVICES INCLUDING THE SAME

RELATED APPLICATION

The present patent document is a division of U.S. patent application Ser. No. 13/152,833, which was filed Jun. 3, 2011, and is hereby incorporated by reference in its entirety.

FIELD OF THE INVENTION

The present invention relates to coated phosphor materials. The present invention also relates to semiconductor devices that include coated phosphor materials.

BACKGROUND OF THE INVENTION

Light emitting diodes ("LEDs") are well known solid state lighting devices that are capable of generating light. LEDs generally include a plurality of semiconductor layers that may be epitaxially grown on a semiconductor or non-semiconductor substrate such as, for example, sapphire, silicon, silicon carbide, gallium nitride or gallium arsenide substrates. One or more semiconductor active layers are formed in these epitaxial layers. When a sufficient voltage is applied across the active layer, electrons in the n-type semiconductor layers and holes in the p-type semiconductor layers flow toward the active layer. As the electrons and holes flow toward each other, some of the electrons will "collide" with a hole and recombine. Each time this occurs, a photon of light is emitted, which is how LEDs generate light. The wavelength distribution of the light generated by an LED generally depends on the semiconductor materials used and the structure of the thin epitaxial layers that make up the active layers of the device.

LEDs typically have a narrow wavelength distribution that is tightly centered about a "peak" wavelength (i.e., the single wavelength where the radiometric emission spectrum of the LED reaches its maximum as detected by a photo-detector). For example, the spectral power distributions of a typical LED may have a full width of, for example, about 10-30 nm, where the width is measured at half the maximum illumination (referred to as the full width half maximum or "FWHM" width). Accordingly, LEDs are often identified by their "peak" wavelength or, alternatively, by their "dominant" wavelength. The dominant wavelength of an LED is the wavelength of monochromatic light that has the same apparent color as the light emitted by the LED as perceived by the human eye. Thus, the dominant wavelength differs from the peak wavelength in that the dominant wavelength takes into account the sensitivity of the human eye to different wavelengths of light.

As most LEDs are almost monochromatic light sources that appear to emit light having a single color, LED lamps that include multiple LEDs that emit light of different colors have been used in order to provide solid state light emitting devices that generate white light. In these devices, the different colors of light emitted by the individual LED chips combine to produce a desired intensity and/or color of white light. For example, by simultaneously energizing red, green and blue light emitting LEDs, the resulting combined light may appear white, or nearly white, depending on the relative intensities of the source red, green and blue LEDs.

White light may also be produced by surrounding a single-color LED with a luminescent material that converts some of the light emitted by the LED to light of other colors. The combination of the light emitted by the single-color LED that passes through the wavelength conversion material along with the light of different colors that is emitted by the wavelength conversion material may produce a white or near-white light. For example, a single blue-emitting LED chip (e.g., made of indium gallium nitride and/or gallium nitride) may be used in combination with a yellow phosphor, polymer or dye such as for example, cerium-doped yttrium aluminum garnet (which has the chemical formula $Y_{3-x}Ce_xAl_5O_{12}$, and is commonly referred to as YAG:Ce), that "down-converts" the wavelength of some of the blue light emitted by the LED, changing its color to yellow. Blue LEDs made from indium gallium nitride exhibit high efficiency (e.g., external quantum efficiency as high as 60%). In a blue LED/yellow phosphor lamp, the blue LED chip produces an emission with a dominant wavelength of about 450-470 nanometers, and the phosphor produces yellow fluorescence with a peak wavelength of about 545-565 nanometers in response to the blue emission. Some of the blue light passes through the phosphor (and/or between the phosphor particles) without being down-converted, while a substantial portion of the light is absorbed by the phosphor, which becomes excited and emits yellow light (i.e., the blue light is down-converted to yellow light). The combination of blue light and yellow light may appear white to an observer. Such light is typically perceived as being cool white in color. In another approach, light from a violet or ultraviolet emitting LED may be converted to white light by surrounding the LED with multicolor phosphors or dyes. In either case, red-emitting phosphor particles may also be added to improve the color rendering properties of the light, i.e., to make the light appear more "warm," particularly when the single color LED emits blue or ultraviolet light.

In some cases, nitride and/or oxynitride phosphors may be used as the red-emitting phosphor. As an example, $(Ca_{1-x-y}Sr_xEu_y)AlSiN_3$ based phosphors have been used as red-emitting (also referred to herein as "red phosphors"). In some cases, the surface of nitride phosphors may become oxidized or otherwise react with the environment over time. In some cases, this may affect the reliability and performance of the phosphor and the devices that include the phosphor.

As noted above, phosphors are one known class of luminescent materials. A phosphor may refer to any material that absorbs light at one wavelength and re-emits light at a different wavelength in the visible spectrum, regardless of the delay between absorption and re-emission and regardless of the wavelengths involved. Accordingly, the term "phosphor" may be used herein to refer to materials that are sometimes called fluorescent and/or phosphorescent. In general, phosphors may absorb light having first wavelengths and re-emit light having second wavelengths that are different from the first wavelengths. For example, "down-conversion" phosphors may absorb light having shorter wavelengths and re-emit light having longer wavelengths.

LEDs are used in a host of applications including, for example, backlighting for liquid crystal displays, indicator lights, automotive headlights, flashlights, specialty lighting applications and even as replacements for conventional incandescent and/or fluorescent lighting in general lighting and illumination applications. In many of these applications, it may be desirable to provide a lighting source that generates light having specific properties.

SUMMARY OF THE INVENTION

Provided according to embodiments of the present invention are methods of coating a phosphor that include contacting the phosphor with a sol that includes at least one of silica, alumina, borate and a precursor thereof, to form a coating on the phosphor; and heating the phosphor.

In some embodiments, the phosphor is a reactive phosphor. Any suitable reactive phosphors may be coated by a method described herein. However, in some embodiments, the reactive phosphor includes a nitride phosphor, including an oxynitride phosphor. In some embodiments, the reactive phosphor includes at least one of $(Sr_{1-x}Ca_x)(Ga_{1-y}Al_y)_2(S_{1-z}Se_z)_4$, activated with Eu and/or Pr, and $(Ca_{1-x}Sr_x)(S_{1-y}Se_y)$, activated with Eu.

In some embodiments, the sol includes a solvent and an acid or a base. In some embodiments, the sol includes colloidal silica. In some embodiments, the sol includes a trialkylborate. In some embodiments, the sol includes alumina and/or aluminum sulfate.

In some embodiments of the invention, the phosphor is heated at a temperature in a range of 100° C. to 800° C., and in some embodiments, at a temperature in a range of 200° C. to 600° C.

The contacting of the phosphor with a sol that includes at least one of silica, alumina, borate and a precursor thereof to form a coating on the reactive phosphor may be performed once, and in some cases may be performed repeatedly on the same phosphor. In the latter case, the process may be repeated using the same sol and/or a different sol.

Also provided herein are phosphors that are coated with alumina, silica and/or borate. In some embodiments, the coated phosphor has a du'v' of less than 0.0015 after 840 hours at 85° C. and 85% relative humidity. Furthermore, in some embodiments, the coated phosphor has an average particle size in a range of 2 to 25 microns.

Additionally, also provided herein are light emitting devices that include a solid state lighting source; and a coated phosphor according to an embodiment of the invention. In some embodiments, other phosphors, such a green and/or yellow phosphor, may also be included in the device.

BRIEF DESCRIPTION OF THE FIGURES

The foregoing and other objects, features and advantages of the invention will become more apparent from the following more particular description of exemplary embodiments of the invention and the accompanying drawings. The drawings are not necessarily to scale, emphasis instead being placed upon illustrating the principles of the invention.

FIGS. 2A-2E are sectional views illustrating fabrication steps that may be used to apply a phosphor composition to an LED chip wafer according to embodiments of the present invention.

DEFINITIONS

Figure 1A:
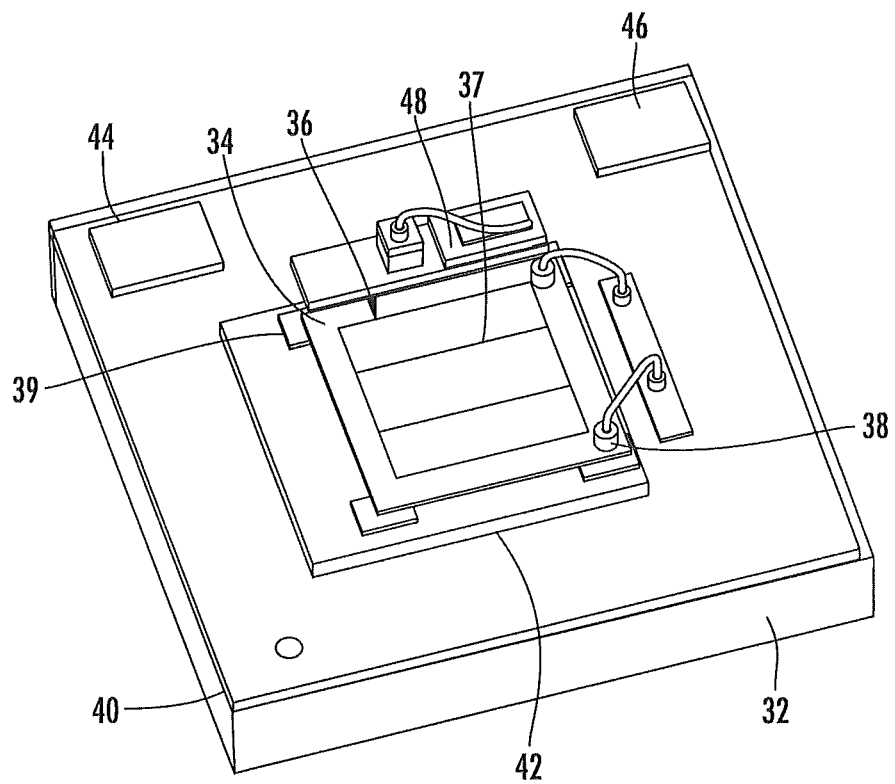
FIGS. 1A-1D are various views of a solid state light emitting device according to embodiments of the present invention.

As used herein the term "alkyl" refers to $C_{1-20}$ inclusive, linear (i.e., "straight-chain"), branched, or cyclic, saturated or at least partially and in some cases fully unsaturated (i.e., alkenyl and alkynyl) hydrocarbon chains, including for example, methyl, ethyl, propyl, isopropyl, butyl, isobutyl, tert-butyl, pentyl, hexyl, octyl, ethenyl, propenyl, butenyl, pentenyl, hexenyl, octenyl, butadienyl, propynyl, butynyl, pentynyl, hexynyl, heptynyl, and allenyl groups. "Branched" refers to an alkyl group in which a lower alkyl group, such as methyl, ethyl or propyl, is attached to a linear alkyl chain. Exemplary branched alkyl groups include, but are not limited to, isopropyl, isobutyl, tert-butyl. "Lower alkyl" refers to an alkyl group having 1 to about 8 carbon atoms (i.e., a $C_{1-8}$ alkyl), e.g., 1, 2, 3, 4, 5, 6, 7, or 8 carbon atoms. "Higher alkyl" refers to an alkyl group having about 10 to about 20 carbon atoms, e.g., 10, 11, 12, 13, 14, 15, 16, 17, 18, 19, or 20 carbon atoms. In certain embodiments, "alkyl" refers, in particular, to $C_{1-5}$ straight-chain alkyls. In other embodiments, "alkyl" refers, in particular, to $C_{1-5}$ branched-chain alkyls.

Alkyl groups can optionally be substituted (a "substituted alkyl") with one or more alkyl group substituents, which can be the same or different. The term "alkyl group substituent" includes but is not limited to alkyl, substituted alkyl, halo, arylamino, acyl, hydroxyl, aryloxyl, alkoxyl, alkylthio, arylthio, aralkyloxyl, aralkylthio, carboxyl, alkoxycarbonyl, oxo, and cycloalkyl. There can be optionally inserted along the alkyl chain one or more oxygen, sulfur or substituted or unsubstituted nitrogen atoms, wherein the nitrogen substituent is hydrogen, lower alkyl (also referred to herein as "alkylaminoalkyl"), or aryl.

Thus, as used herein, the term "substituted alkyl" includes alkyl groups, as defined herein, in which one or more atoms or functional groups of the alkyl group are replaced with another atom or functional group, including for example, alkyl, substituted alkyl, halogen, aryl, substituted aryl, alkoxyl, hydroxyl, nitro, amino, alkylamino, dialkylamino, sulfate, and mercapto.

As used herein, "alkoxyl" refers to an alkyl-O— group wherein alkyl is as previously described. The term "alkoxyl" as used herein can refer to, for example, methoxyl, ethoxyl, propoxyl, isopropoxyl, butoxyl, t-butoxyl, and pentoxyl. The term "oxyalkyl" can be used interchangeably with "alkoxyl". In some embodiments, the alkoxyl has 1, 2, 3, 4, or 5 carbons.

As used herein, the term "silane" refers to any compound that includes four organic groups, such as including any of the organic groups described herein (e.g., alkyl, aryl and alkoxy), bonded to a silicon atom.

As used herein, the term "alkoxysilane" refers to a silane that includes one, two, three, or four alkoxy groups bonded to a silicon atom. For example, tetraalkoxysilane refers to $Si(OR)_4$, wherein R is alkyl. Each alkyl group can be the same or different. An "alkylalkoxylsilane" refers to an alkoxysilane wherein one or more of the alkoxy groups has been replaced with an alkyl group. Thus, an alkylalkoxysilane comprises at least one alkyl-Si bond.

As used herein, the term "alumina" refers to aluminum oxide, typically having the chemical formula of $Al_2O_3$.

As used herein, the term "silica" refers to a silicon oxide, typically silicon dioxide.

As used herein, the term "colloidal silica" and "colloidal alumina" refer to fine particles of silica and alumina, respectively, dispersed in a liquid, for example, dispersed in a solvent described herein.

As used herein, the term "reactive phosphor" includes those phosphors that may react with their environment over time, including phosphors that may react with oxygen and/or water. An example of a reactive phosphor is a nitride phosphor. The term "nitride phosphor" includes both nitride and oxynitride phosphors. Examples of nitride phosphors include $Ca_{1-x}Sr_xAlSiN_3$, $Ca_2Si_5N_8$, $Sr_2Si_5N_8$, $Ba_2Si_5N_8$, $BaSi_7N_{10}$, $BaYSi_4N_7$, $Y_5(SiO_4)_3N$, $Y_4Si_2O_7N_2$, $YSiO_2N$, $Y_2Si_3O_3N_4$, $Y_2Si_{3-x}Al_xO_{3+x}N_{4-x}$, $Ca_{1.5}Si_9Al_3N_{16}$, $Y_{0.5}Si_9Al_3O_{1.5}N_{14.5}$, $CaSiN_2$, $Y_2Si_4N_6C$, and/or $Y_6Si_{11}N_{20}O$. Such materials may include an activator material including at least one of Ce, Eu, Sm, Yb, Gd and/or Tb. Other reactive phosphors include $(Sr_{1-x}Ca_x)(Ga_{1-y}Al_y)_2(S_{1-z}Se_z)_4$, e.g., activated with Eu or Eu and Pr, and $(Ca_{1-x}Sr_x)(S_{1-y}Se_y)$, e.g., activated with Eu. In some embodiments, the reactive phosphors are those found in U.S. patent application Ser. No. 12/271,945, filed Nov. 17, 2008; U.S. patent application Ser. No. 12/466,782, filed May 15, 2009; U.S. patent application Ser No. 13/152,863, filed Jun. 3, 2011, entitled Red Nitride Phosphors; and U.S. patent application Ser. No. 13/153,155, filed Jun. 3, 2011, entitled Methods of Determining and Making Red Nitride Phosphor Compositions, the contents of each of which are incorporated herein by reference in their entirety.

Provided according to some embodiments of the invention are methods of coating a phosphor that include (a) contacting the phosphor with a sol that includes at least one of silica, borate, alumina, and a precursor thereof, to form a coating on the phosphor; and (b) heating the phosphor. The sol may include only one of silica, borate and alumina (and/or a precursor thereof) or it may include any combination thereof. In addition, other components may be included in the sol, as will be discussed in further detail below. In some embodiments, the phosphor is a reactive phosphor. As used herein, the term "sol" refers both to solutions that are homogenous and to solutions that are heterogeneous, thereby including true solutions and also dispersions, colloids, and the like.

In some embodiments, the sol includes a silane as a silica precursor. Any suitable silane, or mixtures thereof, may be included in the sol. However, in some embodiments, the silane includes an alkoxysilane, for example, a tetraalkoxysilane having the formula $Si(OR)_4$, wherein each R is independently an H, alkyl or substituted alkyl. As such, the R groups in the alkoxysilane may be the same or may be different. In particular embodiments, the tetraalkoxysilane may include tetramethoxysilane (TMOS), tetraethoxysilane (TEOS), tetra-n-propoxysilane (TPOS) and/or tetra-n-butoxysilane (TBOS). In some embodiments of the invention, the alkoxysilane may include an alkylalkoxysilane having the formula of $R'$—$Si(OR)_3$, wherein R' is an organic functional group (e.g., alkyl, aryl or alkylaryl) and each R is independently H, alkyl or substituted alkyl. As such, each R may be the same or may be different and each R group may be the same or different as R'. In particular embodiments, the alkoxysilane may include methyltrimethoxysilane (MTMOS), ethyltrimethoxysilane (ETMOS), propyltrimethoxysilane (PTMOS), butyltrimethoxysilane (BTMOS), butyltriethoxysilane (BTEOS), and/or octadecyltrimethoxysilane (ODTMOS). In some embodiments of the invention, the backbone alkoxysilane may include an alkoxysilane having the formula $R'R''$—$Si(OR)_2$, wherein R' and R'' are each independently an organic functional group (e.g., alkyl, aryl or alkylaryl) and each R is independently H, alkyl or substituted alkyl. In some embodiments of the invention, the alkoxysilane may include an alkoxysilane having the formula of $R'R''R'''$—$SiOR$, wherein R', R'' and R''' are each independently an organic functional group (e.g., alkyl, aryl or alkylaryl) and R is H, alkyl or substituted alkyl.

Examples of alkoxysilanes that may be used in some embodiments of the invention include acryloxypropylmethyldimethoxysilane, 3-acryloxypropyltrimethoxysilane, allyltriethoxysilane, allytrimethoxysilane, amyltriethoxysilane, amyltrimethoxysilane, 5-(bicycloheptenyl)methyltriethoxysilane, 5-(bicycloheptenyl)methyltrimethoxysilane, 5-(bicycloheptenyl)dimethylmethoxysilane, 5-(bicycloheptenyl) methyldiethoxysilane, bis(3-cyanopropyl)diethoxysilane, bis(3-cyanopropyl)dimethoxysilane, 1,6-bis(trimethoxysilyl)hexane, bis(trimethylsiloxy)methylsilane, bromomethyldimethylmethoxysilane, 3-bromopropyltriethoxysilane, n-butyldimethylmethoxysilane, tert-diphenylmethoxysilane, n-butyldimethoxysilane, n-butyldiethoxysilane, n-butyltrimethoxysilane, 2-(carbomethoxy)ethyltrimethoxysilane, 4-chlorobutyldimethylmethoxysilane, 4-chlorobutyldimethylethoxysilane, 2-chloroethyltriethoxysilane, chloromethyldimethylethoxysilane, p-(chloromethyl)phenyltriethoxysilane, p-(chloromethyl)phenyltrimethoxysilane, chloromethyltriethoxysilane, chlorophenyltrimethoxysilane, 3-chloropropylmethyldimethoxysilane, 3-chloropropyltriethoxysilane, 2-cyanoethylmethyltrimethoxysilane, (cyanomethylphenethyl)triethoxysilane, 2-(3-cyclohexenyl) ethyl]trimethoxysilane, cyclohexydiethoxymethylsilane, cyclopentyltrimethoxysilane, di-n-butyldimethoxysilane, dicyclopentyldimethoxysilane, diethyldiethoxysilane, diethyldimethoxysilane, diethyldibutoxysilane, diethylphosphatoethyltriethoxysilane, diethyl(triethoxysilylpropyl)malonate, di-n-hexyldimethoxysilane, diisopropyldimethoxysilane, dimethyldimethoxysilane, 2,3-dimethylpropyldimethylethoxysilane, dimethylethoxysilane, diphenydiethoxysilane, diphenyldimethoxysilane, diphenylmethylethoxysilane, 2-(diphenylphosphino)ethyltriethoxysilane, divinylethoxysilane, n-dodecyltriethoxysilane, 2-(3,4-epoxycyclohexyl)ethyltrimethoxysilane, ethyltriethoxysilane, ethyltrimethoxysilane, 3-glycidoxypropyldimethylethoxysilane, (3-glycidoxypropyl)methyldimethoxysilane, 3-glycidoxypropyltrimethoxysilane, n-heptylmethyldimethoxysilane, n-hexadecyltriethoxysilane, 5-hexenyltrimethoxysilane, n-hexyltriethoxysilane, n-hexyltnethoxysilane, 3-iodopropyltriethoxysilane, 3-iodopropyltrimethoxysilane, isobutyltrimethoxysilane, isobutyltriethoxysilane, isocyanatopropyldimethylmethoxysilane, 3-isocyanatopropyltriethoxysilane, isooctyltriethoxysilane, 3-mercaptopropyl-methyldimethoxysilane, 3-mercaptopropyltrimethoxysilane, 3-mercaptopropyltriethoxysilane, 3-methacryloxypropylmethyldiethoxysilane, 3-methacryloxypropyl-methyldiethoxysilane, 3-methacryloxypropyltrimethoxysilane, 3-(4-methoxyphenyl)propyltrimethoxysilane, methylcyclohexyldiethoxysilane, methyldiethoxysilane, methyldimethoxysilane, methyldodecyldiethoxysilane, methyl-n-octadecyldimethoxysilane, methyl(2-phenethyl)dimethoxysilane, methylphenyldiethoxysilane, methylphenyldimethoxysilane, methyl-n-propyldimethoxysilane, methyltriethoxysilane, neophylmethyldiethoxysilane, n-octadecyldimethylmethoxysilane, n-octadecyltriethoxysilane, n-octadecyltrimethoxysilane, 7-octenyltrimethoxysilane, n-octylmethyldimethoxysilane, n-octyltriethoxysilane, phenethyldimethylmethoxysilane, phenethyltriethoxysilane, phenyldimethylethoxysilane, phenyltriethoxysilane, phenyltrimethoxysilane, phthalocyanatodimethoxysilane, n-propyltrimethoxysilane, styrylethyltrimethoxysilane, tetra-n-butoxysilane, tetraethoxysilane, tetrapropoxysilane, (tridecafluoro-1,1,2,2,-tetrahydrooctyl)-1-trimethoxysilane, triethoxysilane, triethoxysilylpropylethyl carbamate, triethylethoxysilane, (3,3,3-trifluoropropyl)methyldimethoxysilane, (3,3,3-trifluoropropyl) triethoxysilane, trimethoxysilane, 1-trimethoxysilyl-2-(p,m-chloromethyl)phenylethane, trimethylethoxysilane, 2-(trimethylsiloxy)ethyl methacrylate, p-trimethylsiloxynitrobenzene, triphenylethoxysilane, n-undeceyltriethoxysilane, vinyldimethylethoxysilane and vinyltrimethoxysilane.

In some embodiments of the invention, the sol may include silica. Any suitable form of silica may be included in the sol, but in some embodiments, the silica is present as colloidal silica. In particular cases, the silica may have an average particle size in a range of 0.1 μm to 2 μm. Examples of colloidal silica that may be used according to some embodiments of the invention include Ludox® CL, which colloidal silica is coated with alumina and is stabilized by a chloride counterion, and Ludox® AM, which colloidal silica is stabilized by sodium aluminate. Ludox® materials are produced by W.R. Grace Inc.

In some embodiments, the sol may include alumina. Any suitable form of alumina may be included in the sol, but in some embodiments the alumina is present as colloidal alumina. In particular cases, the alumina/borane may have an average particle size in a range of 0.1 μm to 2 μm. An example of a type of colloidal alumina that may be used in some embodiments of the invention is Nyacol® Al 20, produced by Nyacol® Nano Technologies, Inc. In some embodiments, the sol includes an alumina precursor. Examples of alumina precursors include aluminum hydroxide and aluminum alkoxides, including aluminum isopropoxide and aluminum butoxide.

In some embodiments, the sol may include borates and/or borate precursors. Examples of borate precursors include trialkylboranes, such as triethylborane, and boron alkoxides.

As one of ordinary skill in the art will appreciate, the precursors may react to form the silica, alumina and/or borates, and may react both in the sol and after coating on the phosphor.

The sol includes a solvent. The volume and type of the solvent employed in the sol may vary. Any suitable solvent may be used. However, examples of solvents include water, methanol, ethanol, propanol, butanol, 2-ethoxyethanol, formamide, dimethylformamide, dioxane, tetrahydrofuran, and mixtures thereof.

The particular concentrations of silica, borates, alumina and/or their precursors, that are included in the sol, as well as the amount of solvent, may be varied.

In some embodiments of the invention, the sol may include a base catalyst. The base catalyst may initiate the process for making the coatings. Any suitable base catalyst may be used. However, examples of base catalysts include ammonia, alkali metal hydroxides, fluorides (NaF) and organic bases. In some embodiments, the concentration of the base catalyst in the sol is in a range of about 0.1M to 2M. In some embodiments, acid catalysts in aqueous or alcoholic solutions at neutral or acidic pH may be included in the sol. Any suitable acid catalyst may be used. However, examples of acid catalysts include hydrochloric acid and sulfuric acid. In some embodiments, the concentration of the acid catalyst in the sol is in a range of about 0.1M to 2M.

In some embodiments of the invention, additives may be included in the sol. Such additives may act to stabilize the sol, the colloid, or to modulate reactivity, or they may be included to vary the properties and/or composition of the coatings. Examples of additives include aluminum sulfate. In some embodiments, drying control additives may be included in the sol to facilitate the drying of the coatings. Such drying control additives may allow for drying of the gel without cracking. Examples of drying control additives include formamide, dimethylformamide, diethylamine amine, acetonitrile, dioxane, glycerol, oxalic acid, surfactants and mixtures thereof.

The sol and the phosphor may be contacted by introducing the phosphor to the sol. The sol may be reacted prior to contact with the phosphor, and may be stirred, for example for a time in a range of 0.1 to 40 hours, prior to contact with the phosphor. In particular cases, the sol may be reacted and/or stirred for a time in a range of 24 to 32 hours prior to contact with the phosphor. Once the phosphor is introduced into the sol, the phosphor may also be reacted and/or stirred with the sol, for example, for a time in a range of 0.1 to 32 hours. In particular cases, the phosphor may be reacted and/or stirred in the sol for a time in a range of 16 to 24 hours.

Any method of coating the phosphor may be used. For example, in some embodiments, the coating procedure may be repeated once, several or many times. The additional layers of coating may be obtained using the same sol and/or may be obtained using different sols, either a sol known to those of skill in the art or a sol described herein. The phosphor may be coated with the sol to form the coating. In some embodiments of the present invention, methods of coating the phosphor include applying the coating to the phosphor via dip-coating, spread-coating, spray coating, spin coating, brushing, imbibing, rolling and/or electrodeposition. Other methods may be used and are known to those of skill in the art.

In some embodiments, a sol according to an embodiment of the invention may be further treated after being applied to the substrate. For example, the coating may be dried under vaccum, photocured, or heat cured to form the sol-gel coating. As additional examples, drying agents may also be applied to aid in the complete co-condensation of the components of the sol precursor solution and to prevent cracking/breaking during evaporation of the sol solvent(s). Additionally the siloxane, aluminum oxide or borane network may be further aged (i.e., driven to complete conversion of silanols into siloxanes bridges) by exposing the coating and substrate to basic solutions up to several orders of magnitude higher in base concentration than that employed during the coating preparation. In another embodiment, radical initiated polymerization and/or photopolymerization of the coating may be performed to strengthen the coating.

In some embodiments of the invention, the coated phosphor is heated to a temperature in a range of 100° C. to 800° C., and in some embodiments, in a range of 200° C. to 600° C. Any suitable apparatus may be used, including those that remain inert at high temperatures and/or that may allow for the desired gas or other heating environment. The heating may help the coating to adhere to the phosphor and/or improve adherence of a coated phosphor to a substrate. Heat curing of the phosphor may be performed in any suitable environment, including but not limited to, air, inert gas such as argon or nitrogen, reducing base (e.g., 95% $N_2$/5% $H_2$) and an oxidizing atmosphere.

Also provided herein are phosphors that are coated with alumina, borate and/or silica, for example, phosphors obtained by a method described herein. The coated phosphors may have improved reliability over the uncoated phosphors. In some cases, light emitting devices that include the coated phosphors under high temperature and high relative humidity conditions (e.g., 85° C. and 85% RH) show reduction in color shift (du'v') on the order of 95% compared to the uncoated phosphor, wherein the device is measured for luminous flux and color maintenance over time (e.g. 336 or 840 hour burn in time). In some embodiments of the invention, the du'v' of the coated phosphors does not exceed 0.0015.

The coated phosphor may be in any suitable form, but in some cases, the phosphor is present in particulate form. In some cases, the phosphor particles have an average particle size in the range of 2.0 to 25 µm. The phosphor may also be present in other forms such as single crystals, such as those described in U.S. Patent Application Publication No. 2008/0283864, which is incorporated herein by reference in its entirety.

The coatings according to embodiments of the invention may be of any suitable thickness. The thickness may depend on the number of layers contained within the coating and on the method used to apply the coating. In some embodiments, the total thickness of the coating may be in a range of from about 0.01 µm to about 10 µm. In particular embodiments, the total thickness of the coating is in a range of about 0.05 to about 1 µm, and in some embodiments, in a range of about 1 to about 8 µm. In some embodiments, the thickness of the coating is less than about 1 µm.

Also provided according to embodiments of the invention are light emitting devices that include a coated phosphor according to an embodiment of the invention. In some embodiments, the light emitting devices may include a solid state lighting source; and a coated phosphor according to an embodiment of the invention. In some cases, light emitting devices that include the coated phosphors under high temperature and high relative humidity conditions (e.g., 85° C. and 85% RH) show reduction in color shift (du'v') on the order of 95% compared to the uncoated phosphor, wherein the device is measured for luminous flux and color maintenance over time (e.g. 336 or 840 hour burn in time). In some embodiments of the invention, the du'v' of the coated phosphors does not exceed 0.0015. In addition, in some cases, the light emitting device may emit warm white light by mixing the coated phosphor with one or more other phosphors. Any suitable other phosphors may be mixed with the coated phosphors described herein, including, for example, $(Y_{1-x}Lu_x)_3(Al_{1-y}Ga_y)_5O_{12}$:Ce where x and y include values in a range from about 0 to about 1, $(Tb_{1-x}RE_x)_3Al_5O_{12}$:Ce phosphor (TAG), $(Ba_{1-x-y}Sr_xMg_y)_2SiO_4$:Eu (BOSE), SIALONs and other green to yellow emitting oxynitride phosphors.

Figure 1B:
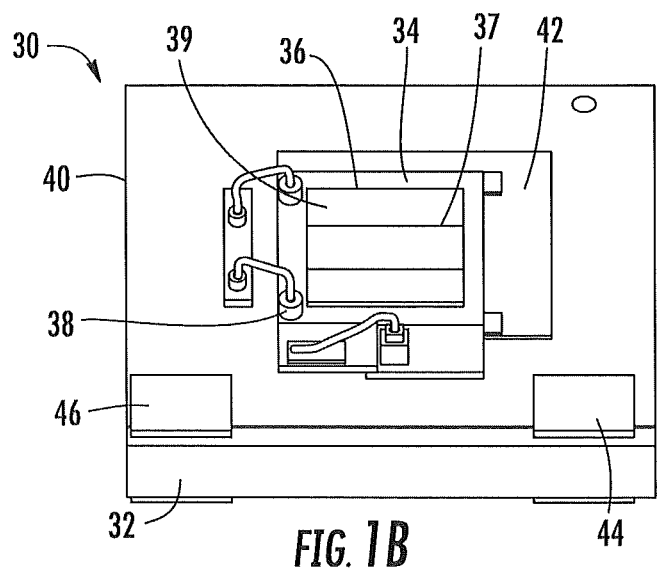
Figure 1C:
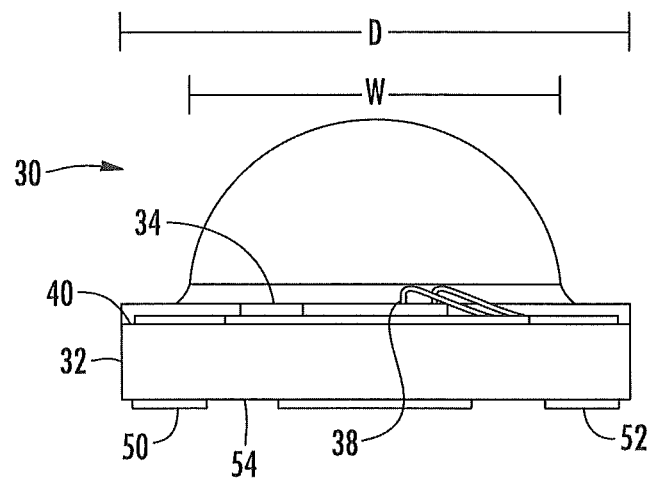
Figure 1D:
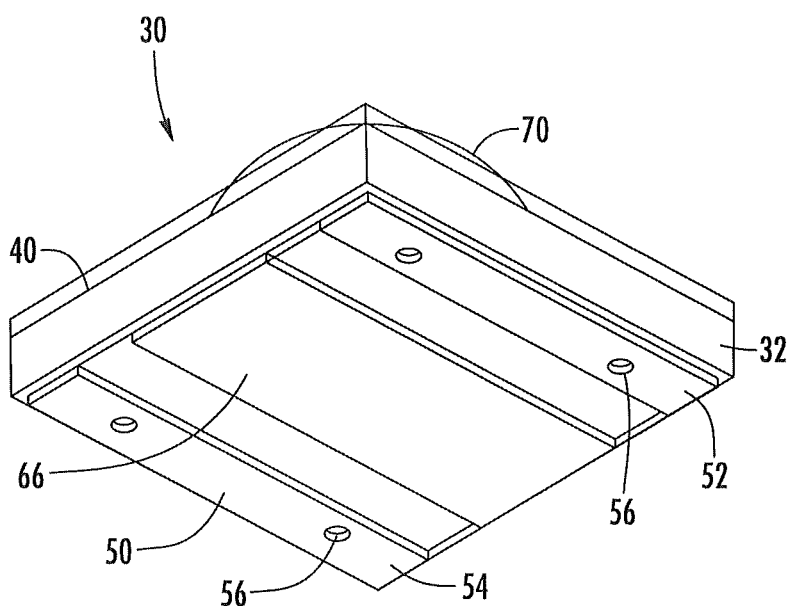

A solid state light emitting device 30 will now be described that includes a phosphor composition according to embodiments of the present invention with reference to FIGS. 1A-1D. The solid state light emitting device 30 comprises a packaged LED. In particular, FIG. 1A is a perspective view of the solid state light emitting device 30 without a lens thereof. FIG. 1B is a perspective view of the device 30 viewed from the opposite side. FIG. 1C is a side view of the device 30 with a lens covering the LED chip. FIG. 1D is a bottom perspective view of the device 30.

As shown in FIG. 1A, the solid state light emitting device 30 includes a substrate/submount ("submount") 32 on which a single LED chip or "die" 34 is mounted. The submount 32 can be formed of many different materials such as, for example, aluminum oxide, aluminum nitride, organic insulators, a printed circuit board (PCB), sapphire or silicon. The LED 34 can have many different semiconductor layers arranged in different ways. LED structures and their fabrication and operation are generally known in the art and hence are only briefly discussed herein. The layers of the LED 34 can be fabricated using known processes such as, for example, metal organic chemical vapor deposition (MOCVD). The layers of the LED 34 may include at least one active layer/region sandwiched between first and second oppositely doped epitaxial layers all of which are formed successively on a growth substrate. Typically, many LEDs are grown on a growth substrate such as, for example, a sapphire, silicon carbide, aluminum nitride (AlN), or gallium nitride (GaN) substrate to provide a grown semiconductor wafer, and this wafer may then be singulated into individual LED dies, which are mounted in a package to provide individual packaged LEDs. The growth substrate can remain as part of the final singulated LED or, alternatively, the growth substrate can be fully or partially removed. In embodiments where the growth substrate remains, it can be shaped and/or textured to enhance light extraction.

It is also understood that additional layers and elements can also be included in the LED 34, including but not limited to buffer, nucleation, contact and current spreading layers as well as light extraction layers and elements. It is also understood that the oppositely doped layers can comprise multiple layers and sub-layers, as well as super lattice structures and interlayers. The active region can comprise, for example, a single quantum well (SQW), multiple quantum well (MQW), double heterostructure or super lattice structure. The active region and doped layers may be fabricated from different material systems, including, for example, Group-III nitride based material systems such as GaN, aluminum gallium nitride (AlGaN), indium gallium nitride (InGaN) and/or aluminum indium gallium nitride (AlInGaN). In some embodiments, the doped layers are GaN and/or AlGaN layers, and the active region is an InGaN layer.

The LED 34 may be an ultraviolet, violet or blue LED that emits radiation with a dominant wavelength in a range of about 380 to about 470 nm.

The LED 34 may include a conductive current spreading structure 36 on its top surface, as well as one or more contacts 38 that are accessible at its top surface for wire bonding. The spreading structure 36 and contacts 38 can both be made of a conductive material such as Au, Cu, Ni, In, Al, Ag or combinations thereof, conducting oxides and transparent conducting oxides. The current spreading structure 36 may comprise conductive fingers 37 that are arranged in a pattern on the LED 34 with the fingers spaced to enhance current spreading from the contacts 38 into the top surface of the LED 34. In operation, an electrical signal is applied to the contacts 38 through a wire bond as described below, and the electrical signal spreads through the fingers 37 of the current spreading structure 36 into the LED 34. Current spreading structures are often used in LEDs where the top surface is p-type, but can also be used for n-type materials.

The LED 34 may be coated with a phosphor composition 39 according to embodiments of the present invention. It will be understood that the phosphor composition 39 may comprise any of the phosphor compositions discussed in the present disclosure.

The phosphor composition 39 may be coated on the LED 34 using many different methods, with suitable methods being described in U.S. patent application Ser. Nos. 11/656,759 and 11/899,790, both entitled Wafer Level Phosphor Coating Method and Devices Fabricated Utilizing Method. Alternatively the phosphor composition 39 may be coated on the LED 34 using other methods such an electrophoretic deposition (EPD), with a suitable EPD method described in U.S. patent application Ser. No. 11/473,089 entitled Close Loop Electrophoretic Deposition of Semiconductor Devices. One exemplary method of coating the phosphor composition 39 onto the LED 34 is described herein with reference to FIGS. 2A-2E.

An optical element or lens 70 (see FIGS. 1C-1D) is formed on the top surface 40 of the submount 32, over the LED 34, to provide both environmental and/or mechanical protection. The lens 70 can be molded using different molding techniques such as those described in U.S. patent application Ser. No. 11/982,275 entitled Light Emitting Diode Package and Method for Fabricating Same. The lens 70 can be many different shapes such as, for example, hemispheric. Many different materials can be used for the lens 70 such as silicones, plastics, epoxies or glass. The lens 70 can also be textured to improve light extraction and/or scattering particles. In some embodiments, the lens 70 may comprise the phosphor composition 39 and/or may be used to hold a phosphor composition 39 in place over the LED 34 instead of and/or in addition to coating a phosphor composition 39 directly onto the LED chip 34.

The solid state light emitting device 30 may comprise an LED package having different sizes or footprints. In some embodiments, the surface area of the LED chip 34 may cover more than 10% or even 15% of the surface area of the submount 32. In some embodiments, the ratio of the width W of the LED chip 34 to the diameter D (or width D, for square lens) of the lens 70 may be greater than 0.5. For example, in some embodiments, the solid state light emitting device 30 may comprise an LED package having a submount 32 that is approximately 3.45 mm square and a hemispherical lens having a maximum diameter of approximately 2.55 mm. The LED package may be arranged to hold an LED chip that is approximately 1.4 mm square. In this embodiment, the surface area of the LED chip 34 covers more than 16% of the surface area of the submount 32.

The top surface 40 of the submount 32 may have patterned conductive features that can include a die attach pad 42 with an integral first contact pad 44. A second contact pad 46 is also included on the top surface 40 of the submount 32 with the LED 34 mounted approximately at the center of the attach pad 42. The attach pad 42 and first and second contact pads 44, 46 may comprise metals or other conductive materials such as, for example, copper. The copper pads 42, 44, 46 may be plated onto a copper seed layer that is, in turn, formed on a titanium adhesion layer. The pads 42, 44, 46 may be patterned using standard lithographic processes. These patterned conductive features provide conductive paths for electrical connection to the LED 34 using known contacting methods. The LED 34 can be mounted to the attach pad 42 using known methods and materials.

A gap 48 (see FIG. 1A) is included between the second contact pad 46 and the attach pad 42 down to the surface of the submount 32. An electrical signal is applied to the LED 34 through the second pad 46 and the first pad 44, with the electrical signal on the first pad 44 passing directly to the LED 34 through the attach pad 42 and the signal from the second pad 46 passing into the LED 34 through wire bonds. The gap 48 provides electrical isolation between the second pad 46 and attach pad 42 to prevent shorting of the signal applied to the LED 34.

Referring to FIGS. 1C and 1D, an electrical signal can be applied to the package 30 by providing external electrical contact to the first and second contact pads 44, 46 via first and second surface mount pads 50, 52 that are formed on the back surface 54 of the submount 32 to be at least partially in alignment with the first and second contact pads 44, 46, respectfully. Electrically conductive vias 56 are formed through the submount 32 between the first mounting pad 50 and the first contact pad 44, such that a signal that is applied to the first mounting pad 50 is conducted to first contact pad 44. Similarly, conductive vias 56 are formed between the second mounting pad 52 and second contact pad 46 to conduct an electrical signal between the two. The first and second mounting pads 50, 52 allow for surface mounting of the LED package 30 with the electrical signal to be applied to the LED 34 applied across the first and second mounting pads 50, 52.

The pads 42, 44, 46 provide extending thermally conductive paths to conduct heat away from the LED 34. The attach pad 42 covers more of the surface of the submount 32 than the LED 34, with the attach pad extending from the edges of the LED 34 toward the edges of the submount 32. The contact pads 44, 46 also cover the surface of the submount 32 between the vias 56 and the edges of the submount 32. By extending the pads 42, 44, 46, the heat spreading from the LED 34 may be improved, which may improve the operating life of the LED and/or allow for higher operating power.

The LED package 30 further comprises a metalized area 66 on the back surface 54 of the submount 32, between the first and second mounting pads 50, 52. The metalized area 66 may be made of a heat conductive material and may be in at least partial vertical alignment with the LED 34. In some embodiments, the metalized area 66 is not in electrical contact with the elements on top surface of the submount 32 or the first and second mounting pads 50, 52 on the back surface of the submount 32. Although heat from the LED is spread over the top surface 40 of the submount 32 by the attach pad 42 and the pads 44, 46, more heat will pass into the submount 32 directly below and around the LED 34. The metalized area 66 can assist with this dissipation by allowing this heat to spread into the metalized area 66 where it can dissipate more readily. The heat can also conduct from the top surface 40 of the submount 32, through the vias 56, where the heat can spread into the first and second mounting pads 50, 52 where it can also dissipate.

It will be appreciated that FIGS. 1A-1D illustrate one exemplary packaged LED that may include phosphor compositions according to embodiments of the present invention. Additional exemplary packaged LEDs are disclosed in, for example, U.S. patent application Ser. No. 12/757,891, filed Apr. 9, 2010. It will likewise be appreciated that the phosphor compositions according to embodiments of the present invention may be used with any other packaged LED structures. The phosphor compositions described herein may also be used in remote phosphor applications whereby the phosphor is not directly on the LED but is optically coupled to the LED.

As noted above, in some embodiments, the phosphor compositions according to embodiments of the present invention may be directly coated onto a surface of a semiconductor wafer before the wafer is singulated into individual LED chips. One such process for applying the phosphor composition will now be discussed with respect to FIGS. 2A-2E. In the example of FIGS. 2A-2E, the phosphor composition is coated onto a plurality of LED chips 110. In this embodiment, each LED chip 110 is a vertically-structured device that has a top contact 124 and a bottom contact 122.

Figure 2A:
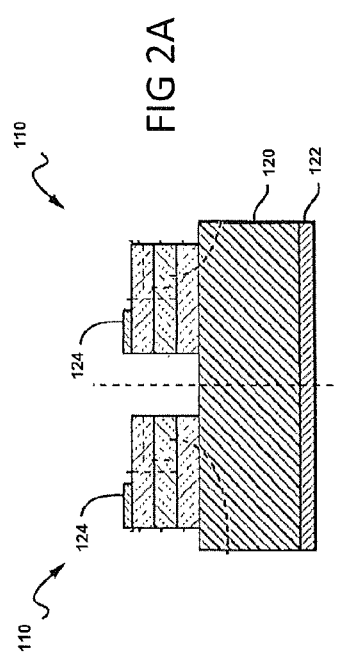

Referring to FIG. 2A, a plurality of LED chips 110 (only two are shown) are shown at a wafer level of their fabrication process (i.e., before the wafer has been separated/singulated into individual LED chips). Each of the LED chips 110 comprises a semiconductor LED that is formed on a substrate 120. Each of the LED chips 110 has first and second contacts 122, 124. The first contact 122 is on the bottom of the substrate 120 and the second contact 124 is on the top of the LED chip 110. In this particular embodiment, the top contact 124 is a p-type contact and the contact 122 on the bottom of the substrate 120 is an n-type contact.

However, it will be appreciated that in other embodiments, the contacts 122, 124 may be arranged differently. For example, in some embodiments, both the contact 122 and the contact 124 may be formed on an upper surface of the LED chip 110.

Figure 2B:
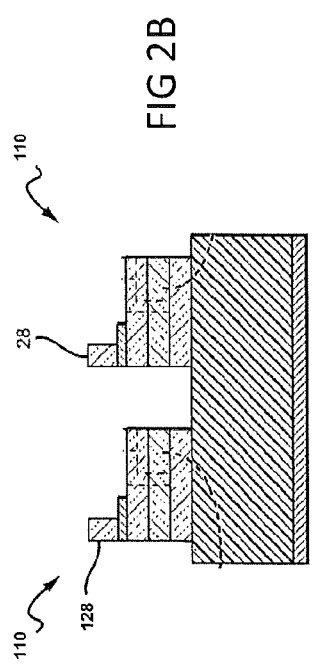

As shown in FIG. 2B, a conductive contact pedestal 128 is formed on the top contact 124 that is utilized to make electrical contact to the p-type contact 124 after the LED chips 110 are coated with a phosphor composition. The pedestal 128 can be formed of many different electrically conductive materials and can be formed using many different known physical or chemical deposition processes such as electroplating, mask deposition (e-beam, sputtering), electroless plating, or stud bumping. The height of the pedestal 128 can vary depending on the desired thickness of the phosphor composition and should be high enough to match or extend above the top surface of the phosphor composition coating from the LED.

Figure 2C:
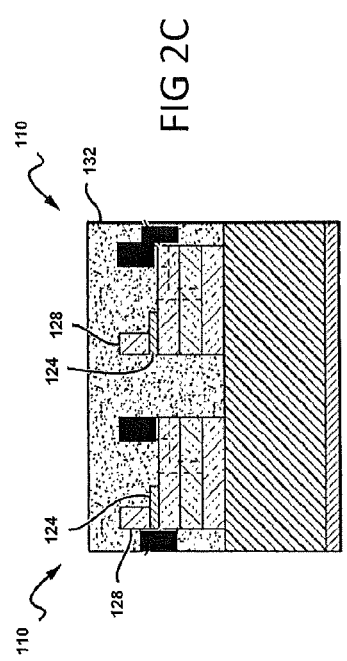

As shown in FIG. 2C, the wafer is blanketed by a phosphor composition coating 132 that covers each of the LED chips 110, the contacts 122, and the pedestal 128. The phosphor composition coating 132 may comprise a binder and a phosphor composition according to an embodiment of the invention. The material used for the binder may be a material that is robust after curing and substantially transparent in the visible wavelength spectrum such as, for example, a silicone, epoxy, glass, inorganic glass, spin-on glass, dielectrics, BCB, polymides, polymers and the like. The phosphor composition coating 132 can be applied using different processes such as spin coating, dispensing, electrophoretic deposition, electrostatic deposition, printing, jet printing or screen printing. Yet another suitable coating technique is disclosed in U.S. patent application Ser. No. 12/717,048, filed Mar. 3, 2010, the contents of which are incorporated herein by reference. The phosphor composition coating 132 can then be cured using an appropriate curing method (e.g., heat, ultraviolet (UV), infrared (IR) or air curing).

Different factors determine the amount of LED light that will be absorbed by the phosphor composition coating 132 in the final LED chips 110, including but not limited to the size of the phosphor particles, the percentage of phosphor loading, the type of binder material, the efficiency of the match between the type of phosphor and wavelength of emitted light, and the thickness of the phosphor composition coating 132. It will be understood that many other phosphors can used alone or in combination to achieve the desired combined spectral output.

Different sized phosphors can be included in the phosphor composition coating 132 as desired before it is applied such that the end coating 132 can have the desired combination of smaller sizes to effectively scatter and mix the light, and larger sizes to efficiently convert the light.

The coating 132 can also have different concentrations or loading of phosphor materials in the binder, with a typical concentration being in range of 30 to 70% by weight. In some embodiments, the phosphor concentration is in a range of 45 to 70% by weight, and is may be generally uniformly dispersed throughout the binder. In other embodiments the coating 132 can comprise multiple layers of different concentrations or types of phosphors, and the multiple layers can comprise different binder materials. One or more of the layers can be provided without phosphors. For example, a first coat of clear silicone can be deposited followed by phosphor loaded layers. As another example, the coating may comprise, for example, a two layer coating that includes a first layer having one type of phosphor on the LED chips 110, and a second layer directly on the first layer that includes a second type of phosphor. Numerous other layer structures are possible, including multi-layers that include multiple phosphors in the same layer, and intervening layers or elements could also be provided between layers and/or between the coating and the underlying LED chips 110.

After the initial coating of the LED chips 110 with the phosphor composition coating 132, further processing is needed to expose the pedestal 128. Referring now the FIG. 2D, the coating 132 is thinned or planarized to expose the pedestals 128 through the top surface of the coating 132. The thinning process exposes the pedestals 128, planarizes the coating 132 and allows for control of the final thickness of the coating 132. Based on the operating characteristics of the LEDs 110 across the wafer and the properties of the phosphor (or fluorescent) material selected, the end thickness of the coating 132 can be calculated to reach a desired color point/range and still expose the pedestals 128. The thickness of the coating 132 can be uniform or non-uniform across the wafer.

As shown in FIG. 2E, after the coating 132 is applied, the individual LED chips 110 can be singulated from the wafer using known methods such as dicing, scribe and breaking, or etching. The singulating process separates each of the LED chips 110 with each having substantially the same thickness of coating 132, and as a result, substantially the same amount of phosphor and thus substantially the same emission characteristics. Following singulation of the LED chips 110, a layer of coating 132 remains on the side surfaces of the LEDs 110 and light emitting from the side surfaces of the LEDs 110 also passes through the coating 132 and its phosphor particles. This results in conversion of at least some of the side emitting light, which can provide LED chips 110 having more consistent light emitting characteristics at different viewing angles.

Following singulation, the LED chips 110 can be mounted in a package, or to a submount or printed circuit board (PCB) without the need for further processing to add phosphor. In one embodiment the package/submount/PCB can have conventional package leads with the pedestals 128 electrically connected to the leads. A conventional encapsulation can then surround the LED chip 110 and electrical connections.

While the above coating process provides one exemplary method of fabricating the solid state light emitting devices according to embodiments of the present invention that include an LED and a phosphor composition, it will be appreciated that numerous other fabrication methods are available. For example, U.S. patent application Ser. No. 11/899,790, filed Sep. 7, 2007 (U.S. Patent Application Publication No. 2008/0179611), the entire contents of which are incorporated herein by reference, discloses various additional methods of coating a phosphor composition coating onto a solid state light emitting device. In still other embodiments, light emitting devices an LED chip that may be mounted on a reflective cup by means of a solder bond or conductive epoxy, and the phosphor composition may comprise an encapsulant material such as, for example, silicone that has the phosphors suspended therein. This phosphor composition may be used, for example, to partially or completely fill the reflective cup.

It is understood that although the present invention has been described with respect to LEDs having vertical geometries, it may also be applied to LEDs having other geometries such as, for example, to lateral LEDs that have both contacts on the same side of the LED chip.

Many different embodiments have been disclosed herein, in connection with the above description and the drawings. It will be understood that it would be unduly repetitious and obfuscating to literally describe and illustrate every combination and subcombination of these embodiments. Accordingly, the present specification, including the drawings, shall be construed to constitute a complete written description of all combinations and subcombinations of the embodiments described herein, and of the manner and process of making and using them, and shall support claims to any such combination or subcombination.

While embodiments of the present invention have primarily been discussed above with respect to solid state light emitting devices that include LEDs, it will be appreciated that according to further embodiments of the present invention, laser diodes and/or other solid state lighting devices may be provided that include the phosphor compositions discussed above. Thus, it will be appreciated that embodiments of the present invention are not limited to LEDs, but may include other solid state lighting devices such as laser diodes.

EXAMPLES

Example Method 1

A solution containing ethanol, tetraethylorthosilicate (TEOS) (30% wt.), water and acetic acid (1M) 1 hr. The solution is thus mixed with a red nitride phosphor for 15 minutes after which the solution is separated from the phosphor and the phosphor is dried and, in some cases, baked at 350° C. for a given amount of time, such as 0.5 to 5 hours.

Example Method 2

A solution containing isopropanol, tetraethylorthosilicate (TEOS) (30% wt.) and hydrochloric acid (1M) or ammonium hydroxide (1M) is prepared and is reacted for 24-32 hours. The solution is thus mixed with a red nitride phosphor for 16 to 24 hours after which the solution is separated from the phosphor and the phosphor is dried and, in some cases, baked at 200° C. for a given amount of time, such as 2-6 hours.

Example Method 3

A solution containing water, commercially available Ludox CL® and hydrochloric acid (1M) is allowed to react for 24 to 32 hours. The solution is thus mixed with a red nitride phosphor for 16 to 24 hours after which the solution is separated from the phosphor and the phosphor is dried and, in some cases, baked at 200° C. for a given amount of time, such as 2-6 hours.

Example Method 4

A solution containing water, commercially available Ludox AM® and hydrochloric acid (1M) is allowed to react for 24 to 32 hours. The solution is thus mixed with a red nitride phosphor for 16 to 24 hours after which the solution is separated from the phosphor and the phosphor is dried and, in some cases, baked at 200° C. for a given amount of time, such as 2-6 hours.

Example Method 5

A solution containing water, TEOS (30% wt.), triethylborate (TEBorate) (30% wt.), isopropanol and hydrochloric acid (1M) is allowed to react for 24 to 32 hours. The solution is thus mixed with a red nitride phosphor for 16 to 24 hours after which the solution is separated from the phosphor and the phosphor is dried and, in some cases, baked at 200° C. for a given amount of time, such as 2-6 hours.

Example Method 6

A solution containing water, commercially available Ludox AM® and hydrochloric acid (1M) or ammonium hydroxide (1M) is allowed to react for 24 to 32 hours. The solution is thus mixed with a red nitride phosphor for 16 to 24 hours after which the solution is separated from the phosphor and the phosphor is dried and, in some cases, baked at 200° C. for a given amount of time, such as 2-6 hours. This procedure is then repeated a second time and the resultant phosphor is introduced to a solution containing water, commercially available Nyacol AL® 20, aluminum sulfate and then sulfuric acid and/or ammonium hydroxide is then added in order to achieve a pH of 6.5.

Results

Figure 3:
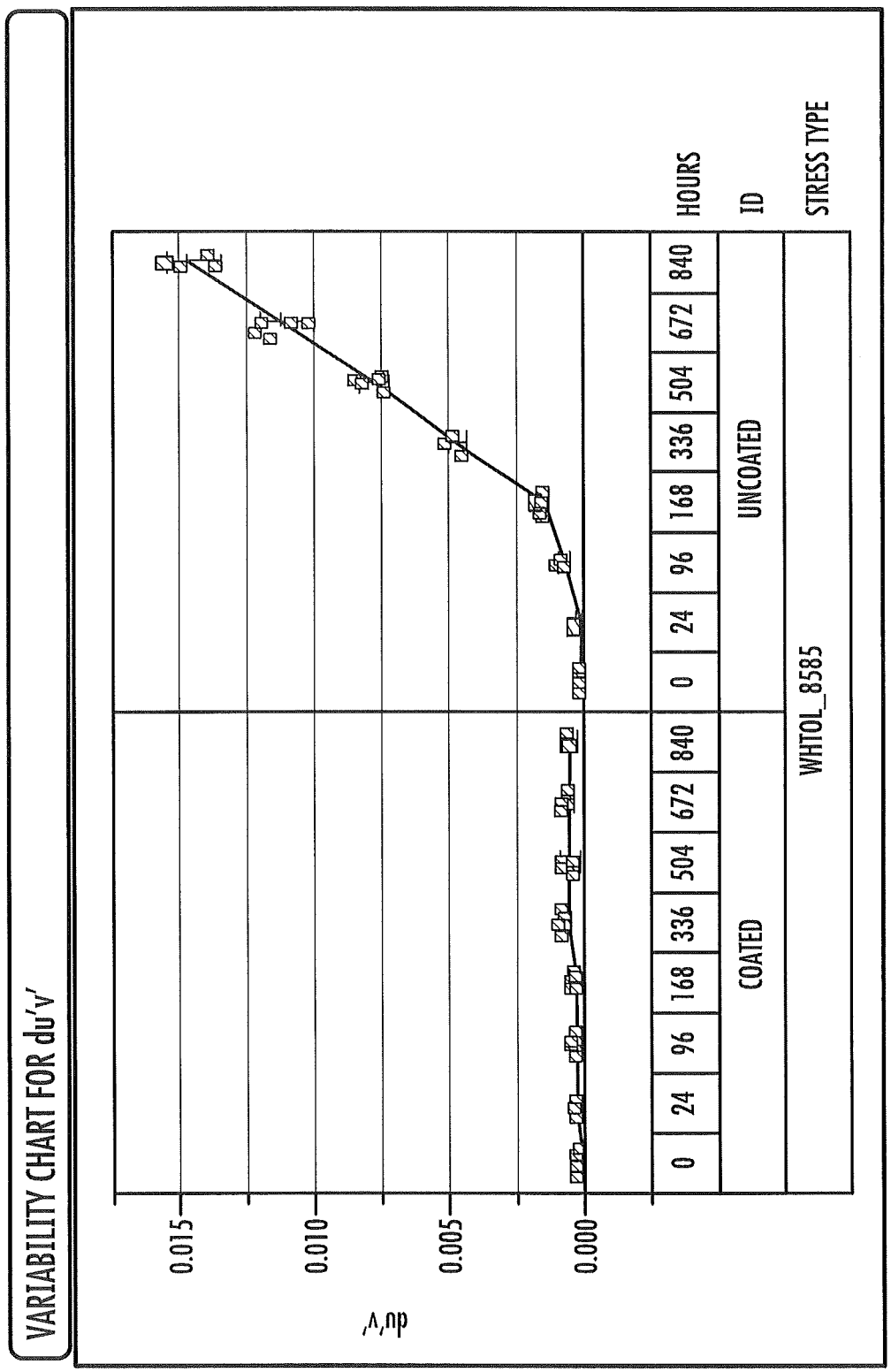
FIG. 3 illustrates the change in duv color shift over time of a light emitting device that includes a coated phosphor according to an embodiment of the invention and a device that includes uncoated phosphor, when both are heated at 85° C. and at 85% relative humidity.
Figure 4:
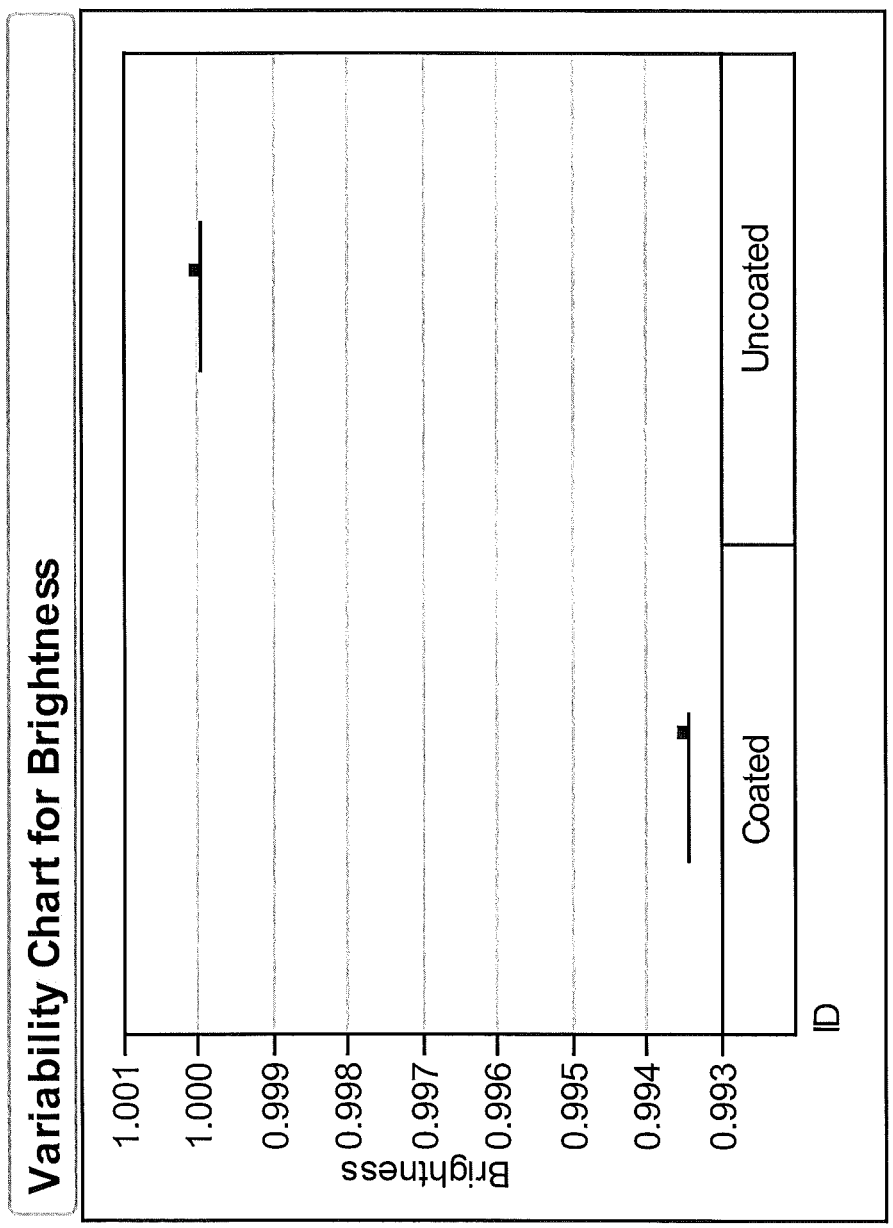
FIG. 4 illustrates the relative luminous flux of a light emitting device that includes a coated phosphor according to an embodiment of the invention and a device that includes uncoated phosphor.

Referring to FIG. 3, uncoated phosphor and the coated phosphor obtained from Example Method 1 were examined for color maintenance over time at 85° C. and 85% humidity. As can be seen in FIG. 3, the samples were tested over 840 hours, with samples being tested for emission color at intervals. The coated sample substantially maintained color throughout the 840 hours (du'v' less than 0.0015) while the color emitted from uncoated phosphor varied over time. Referring to FIG. 4, the coated phosphor and uncoated phosphor from Example Method 1 were tested for luminous flux. The uncoated phosphor is given the brightness of 1, and it is show that the coated phosphor is only 0.7% dimmer than the uncoated phosphor. Similar tests were performed with coated phosphors obtained by the Method Examples 2-6, and improved color maintenance over time at 85° C. and 85% humidity was also seen with such coated phosphors. In addition, the luminous flux of the phosphors prepared by the other methods was not significantly affected by the coating (1% or less dimmer than uncoated phosphor).

FIGS. 3 and 4 show that the coated phosphors according to embodiments of the invention may have improved reliability and stability over uncoated phosphors, without significant decrease in luminous flux. As such, light emitting devices that include such phosphors may also have desirable optical properties while also having improved reliability and stability.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Although specific terms are employed herein, they are used in a generic and descriptive sense only and not for purposes of limitation.

That which is claimed:

1. A method of coating a phosphor comprising:
    (a) contacting a nitride phosphor with a sol comprising: at least one of silica, alumina, borate and a precursor thereof, and an acid catalyst; and
    (b) heating the phosphor at a temperature in a range of 200° C. to 600° C., thereby forming a coated phosphor, wherein the sol comprises at least one of colloidal silica and colloidal alumina, and wherein the sol does not include a precursor of silica, a precursor of alumina, or a precursor of borate.

2. The method of claim 1, wherein the sol further comprises a solvent.

3. The method of claim 2, wherein the solvent comprises at least one solvent selected from the group consisting of water, methanol, ethanol, propanol, butanol, 2-ethoxyethanol, formamide, dimethylformamide, dioxane and tetrahydrofuran.

4. The method of claim 1, wherein the acid catalyst comprises hydrochloric acid.

5. The method of claim 1, wherein the acid catalyst comprises acetic acid.

6. The method of claim 1, wherein the sol comprises a tetraalkylorthosilicate.

7. The method of claim 1, wherein the sol comprises a trialkylborate.

8. The method of claim 1, wherein the sol comprises alumina and/or aluminum sulfate.

9. The method of claim 1, wherein the phosphor is stirred in the sol for a time in a range of 0.1 to 40 hours.

10. A coated phosphor comprising:
a nitride phosphor in particulate form coated with alumina, silica and/or borate, wherein the phosphor has a du'v' of less than 0.0015 after 840 hours at 85° C. and 85% relative humidity.

11. The coated phosphor of claim 10, wherein the phosphor has an average particle size in a range of 2 to 25 microns.

12. The coated phosphor of claim 10, further comprising a green and/or yellow phosphor.

13. The method of claim 1, wherein the nitride phosphor is reacted with the sol for a time in a range of from 16 to 24 hours.

14. The method of claim 1, wherein, prior to contacting the nitride phosphor with the sol, the sol is reacted for a time in a range of 24 to 32 hours.

15. The method of claim 1, further comprising heating the coated phosphor at 200° C. for 2-6 hours.

* * * * *